(12) United States Patent
Uchida

(10) Patent No.: US 8,676,482 B2
(45) Date of Patent: Mar. 18, 2014

(54) HYBRID VEHICLE BATTERY LIFE EVALUATING APPARATUS

(75) Inventor: Masatoshi Uchida, Toyota (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 1227 days.

(21) Appl. No.: 12/160,543

(22) PCT Filed: Feb. 7, 2007

(86) PCT No.: PCT/JP2007/052535
§ 371 (c)(1),
(2), (4) Date: Jul. 10, 2008

(87) PCT Pub. No.: WO2007/091710
PCT Pub. Date: Aug. 16, 2007

(65) Prior Publication Data
US 2010/0235024 A1    Sep. 16, 2010

(30) Foreign Application Priority Data
Feb. 10, 2006  (JP) ................................ 2006-033403

(51) Int. Cl.
*G06F 19/00*    (2011.01)
(52) U.S. Cl.
USPC ........... 701/123; 701/22; 701/29.1; 701/30.5; 701/102; 320/149; 324/428
(58) Field of Classification Search
None
See application file for complete search history.

(56) References Cited

U.S. PATENT DOCUMENTS

| 4,335,429 | A | * | 6/1982 | Kawakatsu | 701/102 |
| 5,349,535 | A | * | 9/1994 | Gupta | 702/63 |
| 5,631,533 | A | * | 5/1997 | Imaseki | 320/118 |
| 5,913,917 | A | * | 6/1999 | Murphy | 701/123 |
| 5,939,794 | A | * | 8/1999 | Sakai et al. | 290/40 A |
| 6,160,380 | A | * | 12/2000 | Tsuji et al. | 320/132 |
| 6,232,743 | B1 | * | 5/2001 | Nakanishi | 320/104 |
| 6,336,063 | B1 | * | 1/2002 | Lennevi | 701/22 |
| 6,424,157 | B1 | * | 7/2002 | Gollomp et al. | 324/430 |
| 6,480,767 | B2 | * | 11/2002 | Yamaguchi et al. | 701/22 |
| 6,625,539 | B1 | * | 9/2003 | Kittell et al. | 701/29.3 |
| 6,793,027 | B1 | * | 9/2004 | Yamada et al. | 180/65.1 |
| 6,826,460 | B2 | * | 11/2004 | Kittell et al. | 701/22 |
| 6,932,174 | B2 | * | 8/2005 | Hirata et al. | 180/65.245 |

(Continued)

FOREIGN PATENT DOCUMENTS

DE    10 2004 040 179 A1    3/2005
JP         6-163084 A       6/1994

(Continued)

*Primary Examiner* — Khoi Tran
*Assistant Examiner* — Jonathan L Sample
(74) *Attorney, Agent, or Firm* — Sughrue Mion, PLLC

(57) ABSTRACT

A hybrid vehicle battery life evaluating apparatus 1 includes an actual traveling measuring section 2 measuring, for each driving pattern, actual gasoline mileage data on a hybrid vehicle equipped with a battery as a power source, a test traveling storage section 3a storing test gasoline mileage data set for each driving pattern on the basis of a traveling test on the vehicle, a battery life evaluating section 5 comparing the measured actual gasoline mileage data with the test gasoline mileage data on the corresponding driving pattern to evaluate a degradation level of the battery on the basis of a value of a decrease in gasoline mileage set for each degradation level of the battery and transmitting information on battery degradation to a battery life display section 6, and the battery life display section 6 displaying the information on battery degradation.

10 Claims, 4 Drawing Sheets

(56) References Cited

U.S. PATENT DOCUMENTS

| | | | |
|---|---|---|---|
| 7,078,877 B2* | 7/2006 | Salasoo et al. | 320/104 |
| 2001/0022518 A1* | 9/2001 | Asakura et al. | 324/426 |
| 2002/0062183 A1* | 5/2002 | Yamaguchi et al. | 701/22 |
| 2002/0116140 A1* | 8/2002 | Rider | 702/63 |
| 2003/0094321 A1* | 5/2003 | Hirata et al. | 180/65.2 |
| 2003/0110075 A1* | 6/2003 | Shioda et al. | 705/13 |
| 2003/0155810 A1* | 8/2003 | Mizuta et al. | 307/10.1 |
| 2003/0184307 A1* | 10/2003 | Kozlowski et al. | 324/427 |
| 2004/0078141 A1* | 4/2004 | Kittell et al. | 701/213 |
| 2004/0090195 A1* | 5/2004 | Motsenbocker | 318/109 |
| 2004/0230376 A1* | 11/2004 | Ichikawa et al. | 702/2 |
| 2006/0055240 A1* | 3/2006 | Toyota et al. | 303/152 |
| 2006/0284617 A1* | 12/2006 | Kozlowski et al. | 324/426 |
| 2007/0029121 A1* | 2/2007 | Saitou et al. | 180/65.2 |
| 2007/0135988 A1* | 6/2007 | Kidston et al. | 701/102 |
| 2010/0106351 A1* | 4/2010 | Hanssen et al. | 701/22 |
| 2010/0235024 A1* | 9/2010 | Uchida | 701/22 |

FOREIGN PATENT DOCUMENTS

| | | |
|---|---|---|
| JP | 7-255133 A | 10/1995 |
| JP | 2001-166677 A | 6/2001 |
| JP | 2003-178342 A | 6/2003 |
| JP | 2003-189407 A | 7/2003 |
| JP | 2003-264906 A | 9/2003 |
| JP | 2003-297435 A | 10/2003 |

* cited by examiner

HYBRID VEHICLE BATTERY LIFE EVALUATING APPARATUS

TECHNICAL FIELD

The present invention relates to a hybrid vehicle battery life evaluating apparatus, and in particular to an apparatus that evaluates the degradation level of a battery based on a value for decreased gasoline mileage measured for various driving patterns, to display information on battery degradation.

BACKGROUND TECHNIQUE

A hybrid vehicle refers to a vehicle equipped with a hybrid system, that is, a system using a combination of two types of power sources, such as a gasoline engine and an electric motor. Examples of the hybrid system include a series hybrid system (S-HEV), a parallel hybrid system (P-HEV), and a system (S&P-HEV) having the functions of both the series hybrid system and the parallel hybrid system. Hybrid systems are characterized in that they selectively employ either the gasoline engine or the electric motor depending on traveling conditions for a vehicle in order to obtain the advantages of the selected power source while compensating for the disadvantages of the unselected power source.

A series hybrid system uses a motor to drive wheels and has an engine operating as a power supply source for the motor. The series hybrid system is thus an electric vehicle with an engine generator. These systems are characterized in that they operate a low-power engine at an almost fixed rotation speed in an area where the engine can operate efficiently, to allow the vehicle to travel while performing efficient charging. On the other hand, the parallel hybrid system uses both the engine and the motor to directly drive the wheels. In this system, the motor supplies supplementary power to the engine while serving as a generator to charge a battery.

Thus, in both of the above-described systems, the hybrid vehicle uses a gasoline engine and an electric motor as power sources. Consequently, compared to conventional vehicles (ICE) of the same type using only the gasoline engine as a power source, the hybrid vehicle generally employs an engine with a smaller displacement (smaller engine swept volume).

On the other hand, the battery mounted in the hybrid vehicle as a power source has a limited life owing to degradation during use. That is, long distance traveling increases the internal resistance of the battery to gradually degrade the charging and discharging capability (battery capacity) of cells. Therefore, the battery in the hybrid vehicle must be replaced at appropriate intervals.

The degradation of the battery hinders the optimal balancing of the gasoline engine and the electric motor, which is a characteristic of the hybrid vehicle as described above. Consequently, the burden on the gasoline engine increase because the degradation of the battery over time impairs the capability of the electric motor which inherently serves as a power source, causing the automatic control to compensate by making greater use of the gasoline engine. As a result, the hybrid vehicle increasingly travels using the gasoline engine having a displacement smaller than that of the conventional vehicles (ICE) of the same type, resulting in a reduced gasoline mileage.

A significant decrease in gasoline mileage occurs more frequently in connection with driving patterns involving cornering, lane changes, acceleration, or deceleration, than in driving patterns in which the vehicle travels at a fixed speed, that is, during normal traveling. During normal traveling, the hybrid vehicle travels mainly using the gasoline engine, and is thus driven and operated in almost the same manner as that in which the conventional vehicle is driven and operated. On the other hand, in the driving patterns such as cornering, lane changes, and deceleration, the system uses both the gasoline engine and the electric motor to effectively utilize both power sources. These driving patterns are also characterized in that the gasoline mileage varies depending on, for example, the traveling speed or track of the vehicle or the driver's driving operation.

For the mileage (fuel efficiency) of conventional hybrid vehicle, for example, average gasoline mileage, instantaneous gasoline mileage, total gasoline mileage, and record-high gasoline mileage are measured and displayed. The display of these gasoline mileage values begins when an ignition switch is turned on. For example, the average gasoline mileage and the instantaneous gasoline mileage indicate the average gasoline mileage and instantaneous gasoline mileage measured every one minute (for about 30 minutes), respectively. The total gasoline mileage indicates the total gasoline mileage from the time of a data resetting operation until the present time. The record-high gasoline mileage indicates the greatest value between the times of the reset operations in the total gasoline mileage display.

As a conventional technique for dealing with battery degradation, a system has been disclosed which detects variation in charging and discharging capability among the cells in order to provide an early warning to urge the driver to perform uniform charging. That is, the charging and discharging capabilities of the cells in the battery are not uniformly degraded, but the degradation varies among the cells. If the variation is excessive, the life of the battery may be adversely affected. Thus, the driver is given a warning. In this case, all the cells can be refreshed to provide for a full charge condition by using an external charger to conduct a low current through the cells for a long time.

On the other hand, Japanese Patent Laid-Open No. 6-163084 discloses a method of measuring the remaining life of an electric vehicle battery. This measuring method determines the remaining life of the battery by measuring, each time the vehicle is operated, a voltage value obtained at a given discharge quantity during the travel, and, on the basis of the relationship between the voltage value and the corresponding number of journeys, determining the difference between the estimated number of journeys at which a preset lifetime voltage is reached and the present number of journeys.

DISCLOSURE OF THE INVENTION

As described above, the battery of hybrid vehicle has a limited lifetime and must be replaced at intervals corresponding to this lifetime. However, there has heretofore been no means for easily evaluating the expected lifetime of a battery in use, and indicating the result of the evaluation to the driving operator. In the hybrid vehicle, the engine operates as an electricity supply source so as to maintain a fixed charged condition during traveling. This eliminates the need for external charging, and the driver is normally not very conscious of the life span of the battery. This also poses a problem.

Even if the degradation of the battery has impaired the charging and discharging capability, the driver often fails to notice this, because the gasoline engine performs automatic control to compensate for the degradation. Thus, in the worst case, the vehicle may be unable to travel during long-distance driving due to degradation of the battery.

Furthermore, the warning system urging the driver to perform uniform charging, which corresponds to the conventional technique describe, does not in any way consider degradation of the charging and discharging capabilities of all the cells over time. Consequently, the system cannot evaluate the degradation of the battery for the hybrid vehicle, and thus is not an apparatus that displays information on battery degradation to the driving operator.

Moreover, according to the method of determining the remaining life of the battery on the basis of the voltage value of the battery as disclosed in Japanese Patent Laid-Open No. 6-163084, whether or not the battery is normal can be determined, but only an estimated value is obtained. Consequently, the method cannot evaluate the degradation of the lifespan of the battery, and thus does not correspond to an apparatus that displays information on battery degradation to the driving operator.

A hybrid vehicle battery life evaluating apparatus according to the present invention is characterized as described below.

(1) The hybrid vehicle battery life evaluating apparatus according to the present invention is characterized by comprising an actual traveling measuring section measuring, for each driving pattern, actual gasoline mileage data for a hybrid vehicle equipped with a battery as a power source, a test traveling storage section storing test gasoline mileage data set for each driving pattern on the basis of a traveling test of the vehicle, a battery life evaluating section comparing the measured actual gasoline mileage data with the test gasoline mileage data to evaluate the degradation level of the battery on the basis of a value of a decrease in gasoline mileage set for each degradation level of the battery and transmitting information on battery degradation to a battery life display section, and the battery life display section displaying the information on battery degradation.

(2) The hybrid vehicle battery life evaluating apparatus according to the present invention is characterized by comprising an actual traveling measuring section measuring, for each driving pattern, actual gasoline mileage data on a hybrid vehicle equipped with a battery as a power source, an actual traveling storage section storing past actual gasoline mileage data measured for each driving pattern, a battery life evaluating section comparing the measured actual gasoline mileage data with the past actual gasoline mileage data for the driving pattern to evaluate degradation level of the battery on the basis of a value of a decrease in gasoline mileage set for each degradation level of the battery and transmitting information on battery degradation to a battery life display section, and the battery life display section displaying the information on battery degradation.

(3) Preferably, in the hybrid vehicle battery life evaluating apparatus, the actual traveling measuring section measures a driving operation for each driving pattern, and the battery life evaluating section determines a driving operator's driving operation on the basis of the measured actual traveling data to compare the actual gasoline mileage data with the test gasoline mileage data taking into account the value of a decrease in gasoline mileage set for each driving operation.

(4) Preferably, the hybrid vehicle battery life evaluating apparatus comprises an actual traveling recording section recording history of the measured actual traveling fuel data for each driving pattern, and the battery life evaluating section compares the measured actual gasoline mileage data, including the last actual gasoline mileage data selected from the history recorded in the actual traveling recording section for each driving pattern, with the test gasoline mileage data for the driving pattern.

(5) Preferably, the hybrid vehicle battery life evaluating apparatus comprises the actual traveling recording section recording the history of the measured actual traveling fuel data for each driving pattern, and the battery life evaluating section compares the measured actual gasoline mileage data, including the last actual gasoline mileage data selected from the history recorded in the actual traveling recording section for each driving pattern, with the past gasoline mileage data for the driving pattern.

(6) Preferably, in the hybrid vehicle battery life evaluating apparatus, the driving pattern is cornering of the vehicle, and the driving operation includes steering, foot brake operation, and accelerator operation. Alternatively, preferably, the driving pattern is a vehicle lane change, and the driving operation includes steering, foot brake operation, and accelerator operation. Alternatively, preferably, the driving pattern is starting and deceleration of the vehicle, and the driving operation includes steering, foot brake operation, and accelerator operation.

BEST MODE FOR CARRYING OUT THE INVENTION

Figure 1:
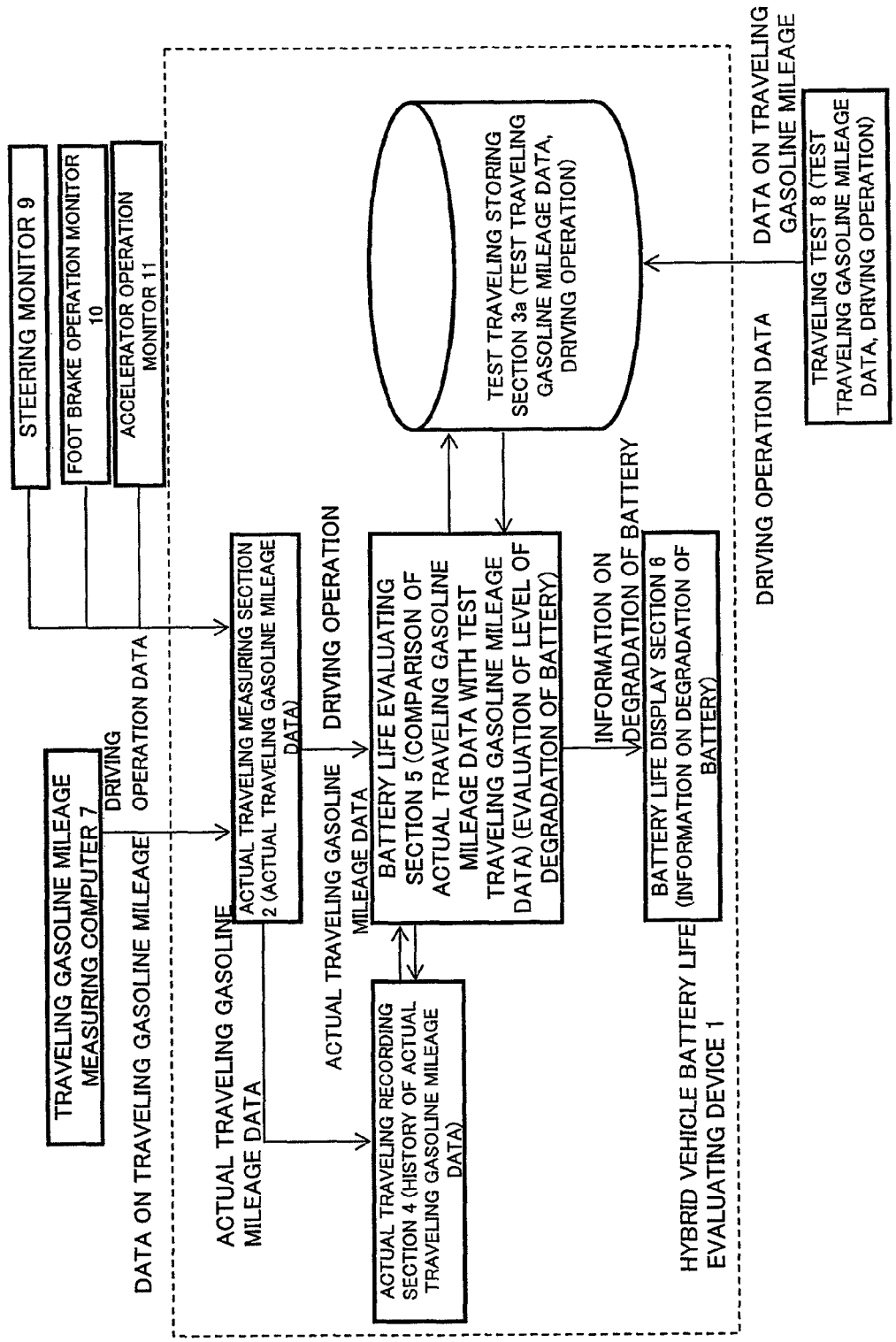
FIG. 1 is a block diagram showing the basic configuration of an embodiment of a hybrid vehicle cell life evaluating apparatus according to the present invention.

Embodiments of the present invention will be described below in detail with reference to the drawings.
1. Battery Life Evaluating Apparatus Based on Test Gasoline Mileage Data FIG. 1 shows a block diagram of the basic configuration of an embodiment of a hybrid vehicle cell life evaluating apparatus. A hybrid vehicle cell life evaluating apparatus 1 comprises an actual traveling measuring section 2, a test traveling storage section 3a, an actual traveling recording section 4, a battery life evaluating section 5, and a battery life display section 6.

The actual traveling measuring section 2 measures actual gasoline mileage data for each driving pattern. Here, the term "each driving pattern" refers to a particular driving pattern, for example, the cornering, lane change, start, or deceleration of the vehicle. The gasoline mileage in the driving pattern refers to the gasoline mileage during a measurement period from the start to end of the driving pattern, that is, the mileage of the gasoline consumed during the measurement period. The average gasoline mileage, instantaneous gasoline mileage, total gasoline mileage, record-high gasoline mileage, and the like of the conventional hybrid vehicle is the gasoline mileage per unit time measured by the gasoline mileage measuring computer 7, and are not the gasoline mileages for the respective driving patterns. Thus, the actual traveling measuring section 2 receives data on the gasoline mileage from the gasoline mileage measuring computer 7 to perform new measurement for each driving pattern.

The measurement period from the start to end of the driving pattern is one appropriate to evaluate the characteristics of the gasoline mileage for each driving pattern. For example, for the cornering or lane change of the vehicle, the measurement period may be between the point in time when the driver begins to turn the steering wheel and the point in time when the driver returns the steering wheel to the original position, or may be during the time when a direction indicator lamp is lit. For the start of the vehicle, the measurement period may be between the point in time when an ignition switch is turned on and the point in time when a specified traveling speed is reached. For deceleration, the measurement period may be between the point in time when a brake operation is started and the point in time when the vehicle is stopped. Moreover, the measurement period may be a specified period set on the basis of an operation of the hybrid system, for example, an operation of a regeneration brake, or on the basis of a battery charging period, or may be supplementary information. The gasoline mileage data measured by the actual traveling measuring section 2 is transmitted to the battery life evaluating section 5.

The actual traveling measuring section 2 further measures the driving operation for each driving pattern of the hybrid vehicle. That is, measurement is made, for each driving pattern, of the history of driving operations, for example, steering, foot brake operations, and accelerator operations, which are performed by the driving operator during the period while the actual gasoline mileage is measured. As shown in FIG. 1, a steering monitor 9, a foot brake operation monitor 10, and an accelerator operation monitor 11 transmit the history of driving operation data to the actual traveling measuring section 2. The actual traveling measuring section 2 generalizes the obtained data to measure the driving operations during the set period. For example, for the cornering of the vehicle, the traveling track during the cornering is measured on the basis of, for example, the history of vehicle speeds and steering. For the start and deceleration of the vehicle, the point in time of the start of acceleration and the point in time of the start of deceleration are measured as data on the basis of the history of foot brake operations, accelerator operations, and the like. These data may include data on the vehicle speed measured immediately before the start of cornering or immediately after the completion of the cornering. The driving operation measured by the actual traveling measuring section 2 is transmitted to the battery life evaluating section 5.

The test traveling storage section 3a stores test gasoline mileage data included in the data on gasoline mileage measured for each driving pattern through a traveling test 8. That is, measurement is made of the mileage of the gasoline consumed during test traveling for the particular driving pattern, namely, the cornering, lane change, start, or deceleration of the vehicle. The data based on the traveling test 8 may be obtained by measurements in a laboratory using a chassis dynamo traveling test facility or by measurements in actual traveling tests using an actual vehicle. Alternatively, these data may be combined. With the test gasoline mileage data, the accuracy of the evaluation of the battery degradation level can be increased by collecting and analyzing more data reflecting the actual traveling or driving operation for the driving pattern.

These test gasoline mileage data reflect traveling conditions during actual traveling. In the present embodiment, the traveling conditions include, for example, the type and weight of the vehicle, a traveling road corresponding to traveling on an express way, traveling in a common urban area, or traveling in a mountain area, and the particular driving pattern such as cornering, lane changing, starting, or deceleration of the vehicle. The traveling conditions may, of course, include other items, and any of the above-described items may be omitted. Moreover, the test gasoline mileage data obtained by measurements under each of the traveling conditions are stored for each driving operation such as the steering, foot brake operation, or accelerator operation.

The test traveling storage section 3a stores driving operations measured during test traveling for each driving pattern. The data obtained are similar to the driving operations measured by the actual traveling measuring section 2 and is thus omitted. These data may include data on the vehicle speed measured immediately before the start of cornering or immediately after the completion of the cornering.

The actual traveling recording section 4 records the history of the measured actual gasoline mileage data for each driving pattern. This history is recorded because the measured actual gasoline mileage data may indicate an abnormally sharp decrease in gasoline mileage resulting from an unusual driving operation performed in an unexpected situation. In order to exclude a possible abnormal value generated in the actual gasoline mileage data, appropriate data is selected from the actual gasoline mileage data recorded for a past driving pattern similar to the driving pattern for which the actual gasoline mileage data has been measured, and the selected data, including the abnormal value, is compared with the test gasoline mileage data. Here, the term "immediately before" may refer to data obtained immediately before the actual gasoline mileage data measured for the driving pattern or data obtained a certain time before the measurement of the actual gasoline mileage data. A method for comparison may include, for example, determining the average value of a plurality of actual gasoline mileage data obtained immediately before the measurement of the actual traveling data and use the average value for comparison, or, if the value is obviously abnormal on the basis of a plurality of last actual gasoline mileage data, correcting the measured actual traveling data for comparison. Furthermore, whether or not normal values, the measured actual gasoline mileage data, including a specified number of last measured values for the same driving pattern, may be continuously compared with the test gasoline mileage data.

The battery life evaluating section 5 first compares the actual gasoline mileage data measured by the actual traveling measuring section 2 with the test gasoline mileage data stored in the test traveling storage section 3a for the driving pattern. The battery life evaluating section 5 evaluates the degradation level of the battery on the basis of the value of a decrease in gasoline mileage set for each degradation level of the battery.

Figure 2:
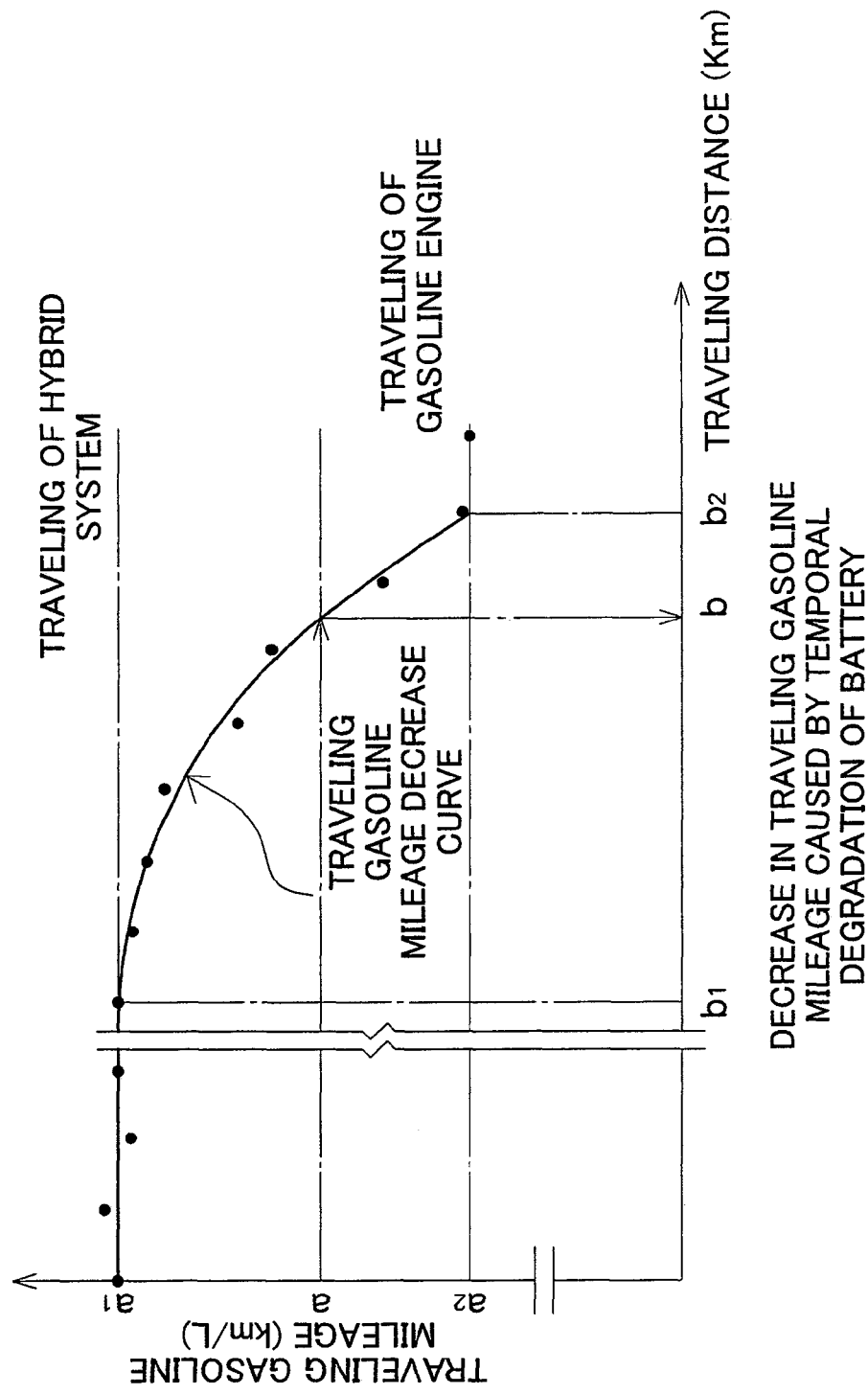
FIG. 2 is a conceptual drawing of the value of a decrease in gasoline mileage caused by degradation of a battery, the value having been extracted from test gasoline mileage data.

FIG. 2 shows a conceptual drawing of the set value of a decrease in gasoline mileage caused by the degradation of the battery, the value having been extracted from the test gasoline mileage data. The axis of abscissa indicates a distance traveled (km). The axis of ordinate indicates the gasoline mileage (km/L). In general, the distance traveled by the vehicle varies around a substantially fixed value (a1) before the degradation of the battery starts. However, when the distance traveled by the vehicle exceeds a certain value (b1), the degradation of the battery starts and the gasoline mileage decreases while varying. The figure shows the gasoline mileage value (a1) obtained during traveling by the hybrid system, that is, when the battery has not been degraded, with the gasoline engine and the electric motor operating efficiently, and the value (b1) of the distance traveled in this case, as well as a gasoline mileage value (a2) obtained when the battery is degraded, with the vehicle traveling using only the gasoline engine, and the value (b2) of the distance traveled in this case. The gasoline mileage, measured for each degradation level of the battery, decreases from the value a1 to the value a2 with increasing distance traveled. The battery life evaluating section 5 extracts a gasoline mileage decrease curve for each driving pattern. The battery life evaluating section 5 then calculates the degradation level of the battery (b/b2) from the value (b) of the distance traveled determined by fitting the value (a) of the actual gasoline mileage to the gasoline mileage decrease curve.

The battery life evaluating section 5 evaluates the driving operator's driving operation on the basis of driving operation history data for each driving pattern transmitted by the actual traveling measuring section 2. That is, the value of the actual gasoline mileage data measured by the actual traveling measuring section 2 contains a variation resulting from the driving operator's driving operation. Thus, this variation is taken into account when comparing the actual gasoline mileage data with the test gasoline mileage data to determine the degradation level of the battery. For example, a person unskilled in the driving of the vehicle generally performs fuel-inefficient driving operations in connection with the traveling track during cornering or the history of the traveling speed. The decrease in gasoline mileage caused by such driving operations is different from the decrease in gasoline mileage caused by the degradation of the battery and thus needs to be excluded for evaluation. Thus, the battery life evaluating section 5 sets a decrease value for each driving operation performed by the driving operator. If the gasoline mileage resulting from driving operations performed by a skilled driving operator is defined as 1.0, for example, a variation in gasoline mileage is set between 1.0 and 0.8. The battery life evaluating section 5 determines the level of a variation in gasoline mileage on the basis of the driving operation history data obtained from the actual driving for each driving pattern. The battery life evaluating section 5 then compares the actual gasoline mileage data with the test gasoline mileage data reduced on the basis of the set value of the decrease in gasoline mileage. Alternatively, the actual traveling mileage data is compared with the test traveling mileage data taking into account the value of the decrease in gasoline mileage set for the actual gasoline mileage data. As the driving operator's driving skill is improved, the decrease value gradually approaches 1.0.

The battery life evaluating section 5 transmits the information on battery degradation to the battery life display section 6. In the present embodiment, the information on battery degradation is the display of the degradation level of the battery and the battery life, or a warning for the battery life. Moreover, the driving operator may be instructed to perform such driving operations as prevent the power source from suffering loads resulting from the degradation of the battery, enabling an increase in distance traveled.

Figure 3:
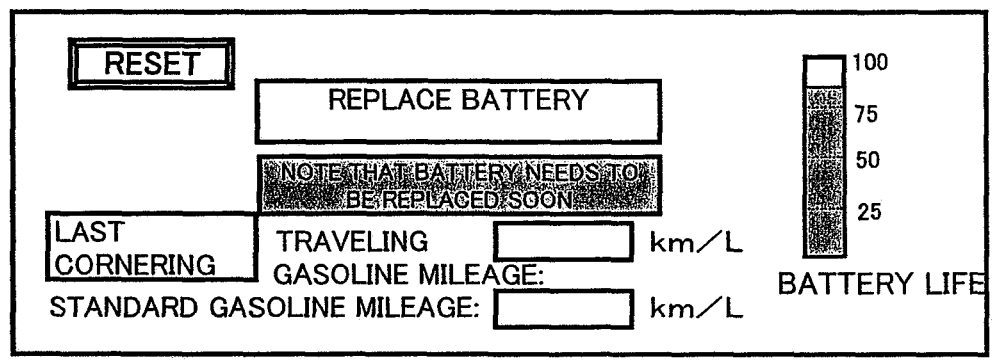
FIG. 3 is a diagram of an embodiment of a display method performed by a battery life display section.

The battery life display section 6 displays information on battery degradation transmitted by the battery transmitted by the battery life evaluating section 5. FIG. 3 shows an embodiment of a display method implemented by the driving evaluation display section 6. In the present embodiment, the driving life display section 6 shows that the driving pattern is cornering, and also shows the measured gasoline mileage (the gasoline mileage during the last cornering) beside the test gasoline mileage data (standard gasoline mileage). Furthermore, for the battery life, the following two levels of warnings are selectively displayed: "Note that battery needs to be replaced soon" and "Replace battery". Moreover, the battery degradation level is shown on a bar graph as the "battery life". The display is performed by any of various methods; any method may be used provided that the method allows the driving operator to appropriately recognize the information on the battery life. Furthermore, the display of the battery life may be incorporated in a conventional energy monitor or may be an independent display screen. Moreover, the display may be a visual display based on a screen, an audio display based on a voice, or a combination thereof.

2. Battery Life Evaluating Apparatus Based on Past Actual Gasoline Mileage Data

Figure 4:
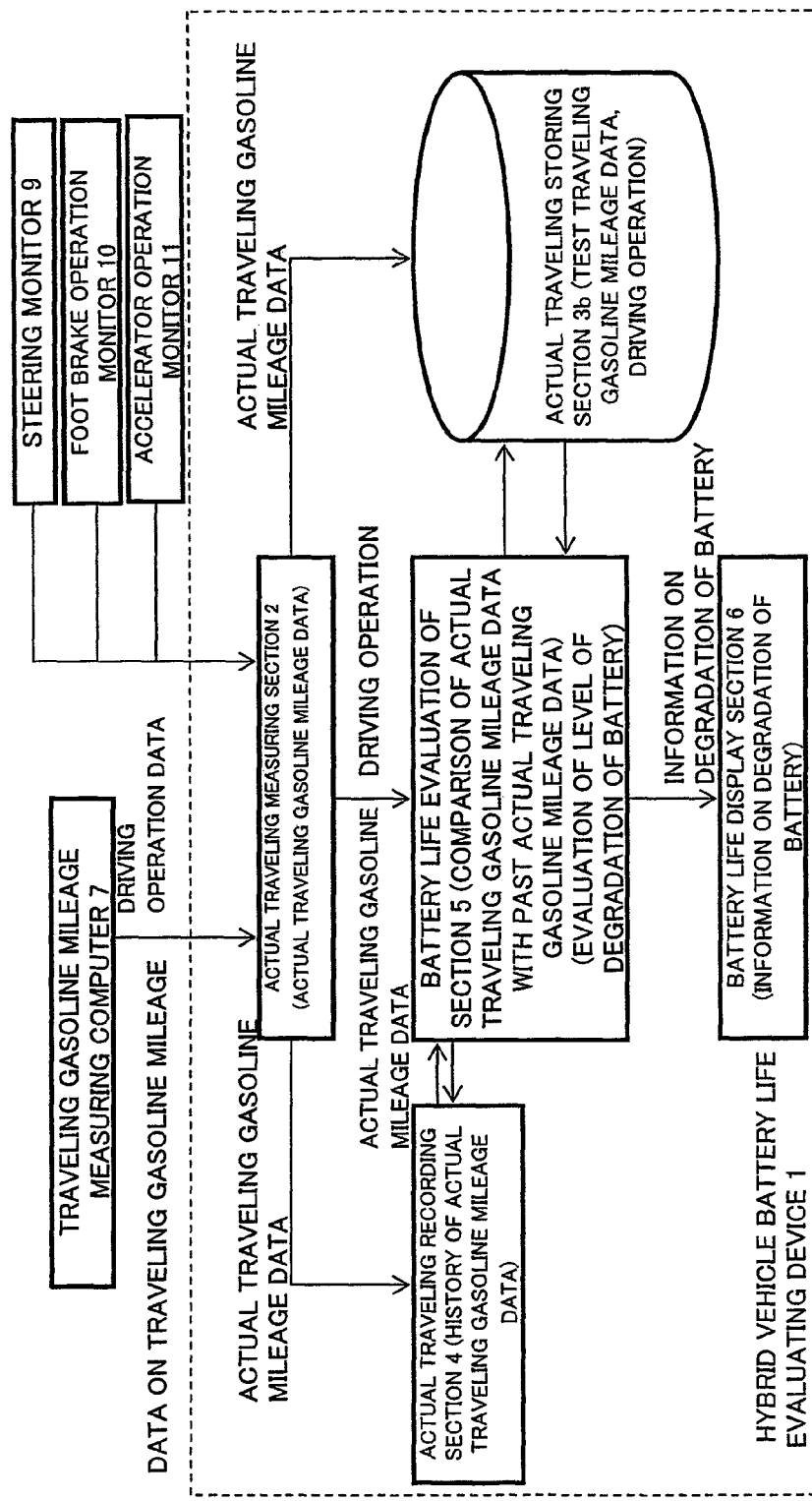
FIG. 4 is a block diagram showing the basic configuration of another embodiment of the hybrid vehicle cell life evaluating apparatus according to the present invention.

FIG. 4 is a block diagram showing the basic configuration of another embodiment of the hybrid vehicle battery life evaluating apparatus. In this case, the actual gasoline mileage data is compared with data on the past actual gasoline mileage of the vehicle. The hybrid vehicle battery life evaluating apparatus 1 is composed of the actual traveling measuring section 2, an actual traveling storage section 3b, the actual traveling recording section 4, the battery life evaluating section 5, and the battery life display section 6. Description will be given of features of the present embodiment which are different from those of the battery life evaluating apparatus based on test traveling data.

The actual traveling storage section 3b stores past actual gasoline mileage data measured for each driving pattern. That is, the data stored in the actual traveling storage section 3b includes actual gasoline mileage data indicating that the battery is not degraded. Thus, if the battery is degraded, the degradation can be confirmed by comparison with the past actual gasoline mileage data. Furthermore, the past actual gasoline mileage data on the vehicle with the degraded battery reflects characteristics such as driving operations by the driving operator of the vehicle. Consequently, the past actual gasoline mileage data involves relatively few decreases in gasoline mileage associated with differences in driving operation. Therefore, the past actual gasoline mileage data enables accurate comparisons. However, if a plurality of driving operators drive the vehicle or the driving operator is changed, the past actual gasoline mileage data does not function. Thus, in this case, the driving operators are pre-registered, and if the driving operator is changed, the registration is updated or the corresponding data is added to the registration.

The battery life evaluating section 5 compares the measured actual gasoline mileage data with the past gasoline mileage data for the driving pattern. That is, the battery life evaluating section 5 tracks the history of the actual gasoline mileage data in the stored past actual gasoline mileage data and selects, for comparison, the actual gasoline mileage data indicating that the battery is not degraded.

The actual traveling recording section 4 records the history of the measured actual gasoline mileage data for each driving pattern. This operation is similar to that in the battery life evaluating apparatus based on the test traveling data and will thus not be described. However, while the past actual gasoline mileage data stored in the actual traveling storage section 3b is selected to evaluate the degradation level of the battery, the past actual gasoline mileage data recorded in the actual traveling recording section 4 is selected to increase the accuracy of evaluation of the measured gasoline mileage data exhibiting an abnormal value.

INDUSTRIAL APPLICABILITY

As described above, the hybrid vehicle battery life evaluating apparatus according to the present invention is useful as an apparatus for evaluating the degree of degradation (the degradation level) of a battery based on the value of a decrease in gasoline mileage measured for each driving pattern, to enable display of information on battery degradation.

The invention claimed is:
1. A hybrid vehicle battery life evaluating apparatus, comprising:
    an actual traveling measuring section which measures, for each driving pattern which is at least one of cornering of the vehicle, the vehicle lane change, starting of the vehicle, and deceleration of the vehicle, actual gasoline mileage data for a hybrid vehicle equipped with a battery as a power source;

a test traveling storage section which stores in advance test gasoline mileage data which is set for each driving pattern on the basis of a traveling test of the vehicle;

a battery life evaluating section which compares the measured actual gasoline mileage data with the test gasoline mileage data on the driving pattern and evaluates a degradation level of the battery on the basis of a value of a decrease in gasoline mileage which is set for each degradation level of the battery and transmits information on battery degradation; and a battery life display section which displays the information on battery degradation received from the battery life evaluating section, wherein the actual traveling measuring section measures a driver's driving operation for each driving pattern, and the battery life evaluating section evaluates the driver's driving operation on the basis of the measured actual traveling data and compares the actual gasoline mileage data with the test gasoline mileage data taking into account the value of a decrease in gasoline mileage which is set for each driving operation.

2. A hybrid vehicle battery life evaluating apparatus, comprising:

an actual traveling measuring section which measures, for each driving pattern which is at least one of cornering of the vehicle, the vehicle lane change, starting of the vehicle, and deceleration of the vehicle, actual gasoline mileage data for a hybrid vehicle equipped with a battery as a power source;

an actual traveling storage section which stores past actual gasoline mileage data measured for each driving pattern;

a battery life evaluating section which compares the measured actual gasoline mileage data with the past actual gasoline mileage data for the driving pattern and evaluates a degradation level of the battery on the basis of a value of a decrease in gasoline mileage set for each degradation level of the battery and outputs information on battery degradation; and a battery life display section which displays the information on battery degradation received from the battery life evaluating section, wherein the actual traveling measuring section measures a driver's driving operation for each driving pattern, and the battery life evaluating section evaluates the driver's driving operation on the basis of the measured actual traveling data and compares the actual gasoline mileage data with the past gasoline mileage data taking into account the value of a decrease in gasoline mileage which is set for each driving operation.

3. The hybrid vehicle battery life evaluating apparatus according to claim 1, further comprising an actual traveling recording section which records a history of the measured actual traveling fuel data for each driving pattern, wherein the battery life evaluating section compares the measured actual gasoline mileage data, including the last actual gasoline mileage data selected from the history recorded in the actual traveling recording section for each driving pattern, with the test gasoline mileage data for the driving pattern.

4. The hybrid vehicle battery life evaluating apparatus according to claim 2, further comprising an actual traveling recording section which records a history of the measured actual traveling fuel data for each driving pattern, wherein the battery life evaluating section compares the measured actual gasoline mileage data, including the last actual gasoline mileage data selected from the history recorded in the actual traveling recording section for each driving pattern, with the past gasoline mileage data for the driving pattern.

5. The hybrid vehicle battery life evaluating apparatus according to claim 1, wherein the driving pattern is cornering of the vehicle, and the driving operation includes a steering operation, a foot brake operation, and an accelerator operation.

6. The hybrid vehicle battery life evaluating apparatus according to claim 1, wherein the driving pattern is a vehicle lane change, and the driving operation includes steering operation, foot brake operation, and accelerator operation.

7. The hybrid vehicle battery life evaluating apparatus according to claim 1, wherein the driving pattern is starting and deceleration of the vehicle, and the driving operation includes steering operation, foot brake operation, and accelerator operation.

8. The hybrid vehicle battery life evaluating apparatus according to claim 2, wherein the driving pattern is the cornering of the vehicle, and the driving operation includes a steering operation, a foot brake operation, and an accelerator operation.

9. The hybrid vehicle battery life evaluating apparatus according to claim 2, wherein the driving pattern is the vehicle lane change, and the driving operation includes a steering operation, a foot brake operation, and an accelerator operation.

10. The hybrid vehicle battery life evaluating apparatus according to claim 2, wherein the driving pattern is the starting and deceleration of the vehicle, and the driving operation includes a steering operation, a foot brake operation, and an accelerator operation.

* * * * *